United States Patent
Wang et al.

(10) Patent No.: US 12,190,972 B1
(45) Date of Patent: Jan. 7, 2025

(54) POWER CONTROL DEVICE AND POWER TEST SYSTEM

(71) Applicant: Hefei Core Storage Electronic Limited, Anhui (CN)

(72) Inventors: Chih-Ling Wang, Anhui (CN); Tong-Jin Liu, Anhui (CN); Qi-Ao Zhu, Anhui (CN); Jing Zhang, Anhui (CN); Ti De Zhang, Shandong (CN); Long Fei Zhang, Anhui (CN)

(73) Assignee: Hefei Core Storage Electronic Limited, Anhui (CN)

( * ) Notice: Subject to any disclaimer, the term of this patent is extended or adjusted under 35 U.S.C. 154(b) by 0 days.

(21) Appl. No.: 18/761,260

(22) Filed: Jul. 1, 2024

(30) Foreign Application Priority Data

Jan. 25, 2024 (CN) .......................... 202410102313.1

(51) Int. Cl.
*G11C 29/08* (2006.01)
*G06F 11/07* (2006.01)
*G06F 11/22* (2006.01)

(52) U.S. Cl.
CPC .......... *G11C 29/08* (2013.01); *G06F 11/0727* (2013.01); *G06F 11/2273* (2013.01); *G06F 11/2284* (2013.01)

(58) Field of Classification Search
CPC .. G11C 29/08; G06F 11/0727; G06F 11/2273; G06F 11/2284
See application file for complete search history.

(56) References Cited

U.S. PATENT DOCUMENTS

| | | | |
|---|---|---|---|
| 2011/0271159 A1 | 11/2011 | Ahn et al. | |
| 2014/0095947 A1* | 4/2014 | Mozak | G11C 29/08 |
| | | | 714/718 |
| 2023/0064884 A1* | 3/2023 | Jiang | G06F 3/0625 |

FOREIGN PATENT DOCUMENTS

| | | | | |
|---|---|---|---|---|
| CN | 109509508 | | 3/2019 | |
| CN | 110931076 | | 3/2020 | |
| CN | 110931076 A | * | 3/2020 | .......... G05B 19/042 |
| CN | 113867640 | | 12/2021 | |
| CN | 114496058 A | * | 5/2022 | |
| CN | 115035946 | | 9/2022 | |
| JP | 2002170389 | | 6/2002 | |
| TW | 201027327 | | 7/2010 | |
| WO | 2021168622 | | 9/2021 | |

* cited by examiner

*Primary Examiner* — Albert Decady
*Assistant Examiner* — Enamul M Kabir
(74) *Attorney, Agent, or Firm* — JCIPRNET

(57) ABSTRACT

A power-supply control device and a power test system are disclosed. The power test system includes a memory and a processor. The processor is configured to: obtain at least one power-supply path manner of at least one power-down test device; determine at least one power-supply path interface according to the at least one power-supply path manner; determine at least one electronic switch according to the at least one power-supply path interface; determine at least one target device to be tested; obtain at least one power-down test instruction according to the at least one target device; establish a target power-supply path corresponding to the target device between the at least one power-supply path interface and the at least one electronic switch according to the power-supply path establishment parameter; and at the target power-supply path, perform a power-down operation according to the power-down execution parameter.

18 Claims, 3 Drawing Sheets

POWER CONTROL DEVICE AND POWER TEST SYSTEM

CROSS-REFERENCE TO RELATED APPLICATION

This application claims the priority benefit of China application serial no. 202410102313.1, filed on Jan. 25, 2024. The entirety of the above-mentioned patent application is hereby incorporated by reference herein and made a part of this specification.

BACKGROUND

Technical Field

The present invention relates to a technical field of storage device testing, and in particular, to a power control device and a power test system.

Description of Related Art

Most storage devices undergo power-down testing during the development stage to ensure that the storage device has sufficient stability during use by users. However, in actual scenarios, the power-supply methods for different types of storage devices may be different. When power-down testing of different types of storage devices is required, additional power-supply equipment, connecting cables and interface circuits of different specifications need to be used to meet the power-supply requirements of different types of storage devices. However, such a test environment is not conducive to large-scale testing of a large number of storage devices that may be of different types, and its power-down test efficiency is low.

SUMMARY

This application provides a power control device and a power test system to solve the problem of low efficiency of power-down test of current storage devices.

In a first aspect, this application provides a power test system. The system includes a memory and a processor. Instructions executed by the processor are stored in the memory. The processor is configured to perform the following steps:
  obtaining at least one power-supply path manner of at least one power-down test device;
  determining at least one power-supply path interface according to the at least one of power-supply path manner;
  determining at least one electronic switch according to the at least one power-supply path interface, wherein the electronic switch is used to control changes in electric energy;
  determining at least one target device to be tested;
  obtaining at least one power-down test instruction according to the at least one target device, wherein each of the power-down test instruction includes a power-supply path establishment parameter and a power-down execution parameter;
  according to the power-supply path establishment parameter, establishing a target power-supply path corresponding to the target device between the at least one power-supply path interface and the at least one of the electronic switch;
  on the target power-supply path, performing a power-down operation according to the power-down execution parameter to perform a power-down test on the target device.

Further, obtaining at least one power-down test instruction according to the at least one target device further includes the processor performing the following steps:
  obtaining device information of the at least one target device;
  matching the device information with a power-down test table to obtain the at least one power-down test instruction, wherein a mapping relationship between the device information and the at least one of the power-down test instruction is stored in the power-down test table;
  wherein the power-down test table is pre-established, and before obtaining the at least one power-down test instruction according to the at least one the target device, the processor further performs the following steps:
  determining the device information of different power-down test devices;
  determining the power-supply path manner and power-down triggering manner of the corresponding power-down test device according to the device information;
  determining a power-supply path generation instruction set according to the power-supply path manner, wherein the power-supply path generation instruction set and the power-supply path establishment parameter have a mapping relationship therebetween;
  determining a power-down timing triggering instruction set according to the power-down triggering manner, wherein the power-down timing triggering instruction set and the power-down execution parameter have a mapping relationship therebetween;
  generating the power-down test table according to the device information, the power-supply path establishment parameter and the power-down execution parameter, so as to execute the corresponding power-supply path generation instruction set and the power-down timing triggering instruction set according to the power-down test table.

In this application, a new idea based on unified and systematic power-down test is proposed. The test user only needs to connect the target device to be tested to the power test system, and the power test system can establish test environments and power-down test operations required by the target device to support power-down tests for a variety of different target devices. Specifically, this application can establish a power-down test table having a mapping relationship with the target device based on the power-supply path manner and the power-down triggering manner, and quickly and accurately generate the power-supply path generation instruction set and the power-down timing triggering instruction set related to the power-down test through the power-down test table, and implement a complete power-down test based on these instruction sets.

Further, establishing the target power-supply path corresponding to the target device from the at least one power-supply path interface and the at least one electronic switch according to the power-supply path establishment parameter further includes the processor executing the following step:
  determining the power-down test path and a voltage control interval of the target device according to the power-supply path establishment parameter;

according to the power-down test path, select the power-supply path interface that satisfies the power-down test path from the at least one power-supply path interface as a first path point;

according to the power-down test path, select the electronic switch that satisfies the voltage control interval from the at least one electronic switch as a second path point;

establishing a connection relationship from the first path point to the second path point to obtain the target power-supply path.

In this application, a manner for establishing a target power-supply path is provided. By disassembling the power-supply path interface and the electronic switch, it can be flexibly transformed and switched to various forms required for power-down test. The target power-supply path of the target device can be quickly established, which significantly improves the testing efficiency of power-down test on different target devices.

Further, on the target power-supply path, performing a power-down operation according to the power-down execution parameter further includes the processor performing the following steps:

when the target device performs a power-down test through the target power-supply path, generating an event observation instruction according to the power-down execution parameter, wherein the event observation instruction is used during the power-down test;

determining the power-down test event to which the target device currently belongs according to the event observation instruction;

obtaining corresponding at least one power-down feature information according to the power-down test event;

using the at least one power-down feature information to determine the power-down triggering timing of the power-down test, and generating a power-down timing triggering instruction according to the power-down triggering timing to use the power-down timing triggering instruction to execute the power-down operation after a default time cycle.

In this application, the event observation instruction is used to realize full timing control of the circuit status. The power test system can determine the power-down test event to which the current target device belongs through event observation during the test process, and accurately calculate the power-down timing by obtaining at least one power-down feature information, so as to allow the power-down test to be arranged at the optimal time, and to make the power-down test timing of the target device to be controllable.

Further, determining the power-down test event to which the target device currently belongs based on the event observation instruction further includes the processor performing the following steps:

obtaining a power-down test count and one-time power-down test clock value according to the event observation instruction;

when the power-down test count is 0, determining the power-down test event to which the at least one target device currently belongs as an initial power-down test event, and each time a new power-down test event is confirmed, set a count value of the power-down test event to be increased by 1, and after the initial power-down test event ends, the count value of the power-down test event is set to 1;

when the power-down test count is not 0, and a difference between a current one-time power-down test clock value and a previous one-time power-down test clock value is greater than a preset times of a clock cycle, determining the power-down test event to which the at least one target device currently belongs as the new power-down test event, and the count value of the power-down test event is increased by 1;

each time the power-down test is performed, determining the power-down test event to which the at least one target device belongs according to the count value of the power-down test event, so as to perform a corresponding power-down operation.

In this application, the operation status of the target power-supply path is reflected at two levels: power-down test count and one-time power-down test clock value, and the power-down test event to which the current target device belongs can be accurately obtained, thereby executing the appropriate power-down operation for the power-down test event.

Further, obtaining the corresponding at least one power-down feature information according to the power-down test event further includes the processor performing the following steps:

querying a power-down test feature table according to the power-down test event, wherein the power-down test feature table stores a numerical mapping relationship between a power-down test event number and a power-down feature information number;

converting the power-down test event into the power-down test event number, and determine the power-down feature information number according to the numerical mapping relationship and the power-down test event number;

obtaining the power-down feature information corresponding to the power-down test event according to the power-down feature information number.

In this application, by digitizing the power-down test event and the power-down feature information, a two-dimensional streamlined association is achieved. The power test system can quickly obtain at least one corresponding power-down feature information based on the power-down test event, and use this power-down feature information to improve the control of power-down triggering timing.

Further, using the at least one power-down feature information to determine the power-down triggering timing of the power-down test further includes the processor performing the following steps:

obtaining a power-down feature value corresponding to each type of the power-down feature information from the at least one power-down feature information;

determining a power-down feature interval value according to the power-down feature value;

obtaining a difference value between the power-down feature interval value and the corresponding power-down feature value, wherein the difference value has a multiple relationship with a clock cycle;

obtaining a one-time conversion table corresponding to the power-down feature interval value, and calculate a target time predicted by the difference value of the power-down feature value according to the one-time conversion table;

obtaining an occurrence time corresponding to the power-down feature interval value, and determine the power-down triggering timing of the power-down test according to the occurrence time corresponding to the power-down feature interval value and the target time predicted by the difference value of the power-down feature value.

In this application, the time difference between the power-down feature value and the power-down feature interval value can be calculated by using the one-time conversion table, such that the power-down triggering timing can be accurately predicted in a case that mapping relationship between the power-down triggering timing and each type of power-down feature value cannot be established.

Further, before using the at least one power-down feature information to determine the power-down triggering timing of the power-down test, the processor further performs the following steps:

establishing a mapping relationship between the power-down feature interval value and a power-down feature interval, wherein the number of the power-down feature interval is one or more, and each power-down feature interval corresponds to one power-down feature interval value;

determining a power-down test occurrence time according to the power-down feature interval value;

in each of the power-down feature interval, calculating a conversion value corresponding to a one-time clock cycle with a corresponding power-down feature interval value as a reference, and storing the conversion value in the one-time conversion table, so as to predict the power-down triggering timing of the power-down test by using the one-time conversion table.

This application provides a specific implementation manner for establishing a one-time conversion table. By using a manner of converting time based on numerical differences, the accuracy of power-down triggering timing prediction can be improved.

Further, the processor further performs the following steps:

obtaining a newly added power-down test device;

determining whether a new power-supply path manner needs to be added based on the newly added power-down test device;

if it is necessary to add the new power-supply path manner, adding a power-supply path interface corresponding to the new power-supply path manner in the power test system;

determining whether a new electronic switch needs to be added based on the newly added power-down test device;

if it is necessary to add the new electronic switch, adding the new electronic switch in the power test system.

In this application, the addition of new power-down test devices can be supported under the originally constructed power-down test system, which is highly inclusive and scalable, and is also easy to implement.

In the second aspect, the present application provides a power control device, which includes the power test system as described in the first aspect and at least one target device to be tested.

In this application, a power test system for realizing power-down test is provided. The power test system integrates the power-supply path interfaces and electronic switches in this system based on the power-supply path manners of the power-down test devices, and through the power-supply path interfaces and electronic switches, the corresponding target power-supply path can be built according to the target devices to be tested and the actual test scenario. Among them, the target path construction process realizes logical docking and construction through a dedicated controller in the system. In addition, the controller can also perform the power-down operation expected by the user through the power-down execution parameter on the target power-supply path according to the power-down test requirements, thereby achieving fast, accurate, comprehensive and flexible power-down test on the target device. In this application, the power test system can solve the original problems of too many test steps and difficulty in setting up a test environment. It can realize different power-down tests on different storage devices in one system, and support test users to change the different test scenarios during the test process, thereby improving the power-down test efficiency of storage devices.

DESCRIPTION OF THE EMBODIMENTS

Figure 1:
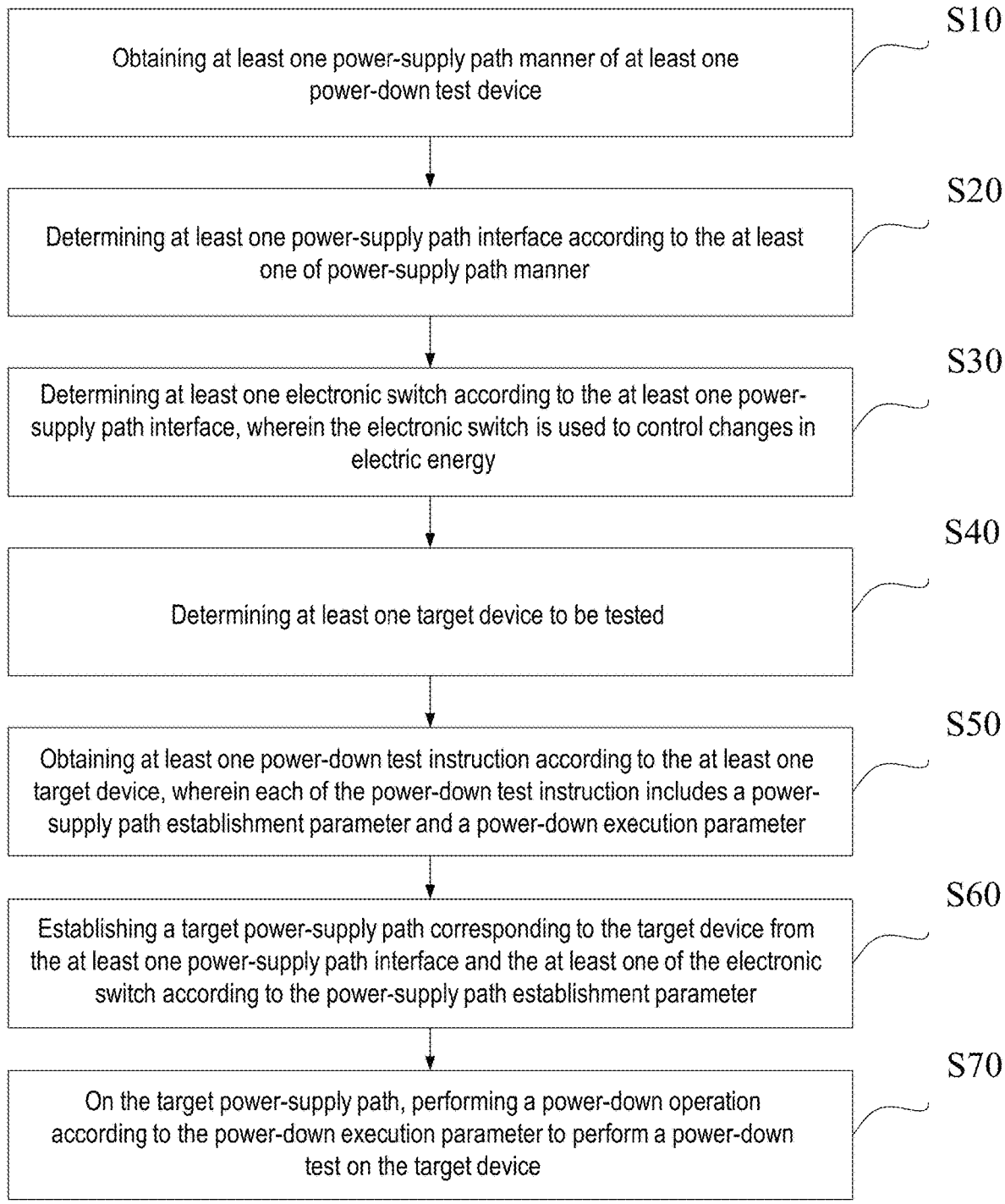
FIG. 1 is a schematic flowchart of a power test method according to an embodiment of the present application.

Reference will now be made in detail to the exemplary embodiments of the present application, examples of which are illustrated in the accompanying drawings. Whenever possible, the same reference numbers are used in the drawings and description to refer to the same or similar parts.

In the field of semiconductor storage, in order to consider the functional completeness of the storage device, it is necessary to conduct relevant verification on the power-supply test of the storage device during the development stage of the storage device, which mainly includes power-down test of the storage device. Power-down of a storage device describes a situation in which a storage device cannot work normally due to power off, loss of power, or power quality that does not meet the requirements. For storage media such as Nand Flash, power-down of the carrier storage device of storage media directly affects the performance of storing data, thus the power-down test is greatly meaningful to the storage device. However, in actual applications, there are several different power-down test manners for the same storage device, and power-down tests for different types of storage devices are quite complicated to implement.

In this application, a new solution is proposed in view of the difficulties encountered by the storage device in the power-down test. Specifically, as shown in FIG. 1, FIG. 1 is a schematic flowchart of a power test method according to an embodiment of the present application. Among them, the power test method can be executed and implemented in a power test system. The power test system executes the following steps through one or more processors in the power test system according to the instructions stored in the memory:

S10: Obtaining at least one power-supply path manner of at least one power-down test device.

In one embodiment, this application uses Nand Flash storage media as an example to describe the power-down test of the storage device. First of all, this application records storage devices that use Nand Flash as storage media, such as different types of SSD (Solid State Disk, solid state drive), pen drives and other related storage devices. Then, these storage devices can be classified according to the implementation manners of storage medium, such as SSD being divided into one group, and pen drive being divided into another group. Furthermore, storage devices in the same group can be further classified according to models and so on, so as to determine the storage devices to be tested (i.e., power-down test device).

Understandably, in practical applications, facing so many kinds of power-down test devices, it is very difficult to achieve a fast, comprehensive and accurate power-down test. Testers often need to re-establish different test paths to meet the power-down tests for multiple power-down test devices. This method is complex and error-prone, and is lack of power-down test efficiency.

In this application, firstly, the power-supply path manner of the power-down test device is obtained, to perform uniformly management and deployment on power-down test devices based on the power-supply path manner. It is understandable that, for example, for a pen drive, its power-supply path manner may include power input, USB (Universal Serial Bus) input, etc. The power-supply path manner of the USB input can include an input manner that only implements the charging function, and another input manner that implements both the charging function and the data transmission function. For SSD, similar to a pen drive, in addition to the above power-supply path manner, it further includes power-supply path manner corresponding to different protocol interfaces. In this application, for such a large number and complex power-supply path manners, the power-supply path manners used by the power-down test devices are summarized, so as to perform fast and accurate power-down tests on different storage devices based on these power-supply path manners.

S20: Determining at least one power-supply path interface according to the at least one of power-supply path manner.

In one embodiment, these power-supply path manners are integrated and implemented on different power-supply path interfaces in this application. One or more power-supply path manners can correspond to a power-supply path interface, for example, the power input interface corresponds to the power-supply path manner of power input. The power-supply path manner of USB input can be used such as a hub integrated into a USB input interface. Two input manners used only for charging and both for charging and data transmission in power-supply path manners of USB can also be integrated into the USB input interface. This can effectively reduce the number of power-supply path interfaces and facilitate the integration of power-supply path interface for power-down test.

In one embodiment, this application uses a limited number of power-supply path interfaces to provide a basis for establishing test paths for different power-down test devices to perform power-down tests. Under a system based on this power-supply path, when performing power-down test, the power test system can always find the appropriate power-supply path interface and support the rapid establishment of the corresponding test path. The determination of at least one power-supply path interface is an important technical implementation basis for implementing the power test system and the implement of arrangement of unity power-down tests for different storage devices.

S30: Determining at least one electronic switch according to the at least one power-supply path interface, wherein the electronic switch is used to control changes in electric energy.

In an embodiment, the electronic switch may have multiple forms of expression. Specifically, the electronic switch may refer to a MOSFET (Metal-Oxide-Semiconductor Field-Effect Transistor), or it may also be an electronic component such as a signal relay. Among them, the function of the electronic switch is to realize change control of input electric energy. The input electric energy can be output after processing with certain changes, for example, to control the changes of voltage value such as boosting and reducing voltage. Among them, for the power-supply path interface that mainly provides power-supply function, the corresponding MOSFET can be specifically set to control the input voltage value through the MOSFET to achieve the control effect of the power-down function; for communication-based power-supply path interface, the corresponding signal relay can be specifically set to ensure that the signal is not distorted.

In one embodiment, one power-supply path interface can correspond to one electronic switch, and multiple power-supply path interfaces can correspond to one or more electronic switches. Among them, one possible implementation way is to set one corresponding electronic switch for each power-supply path interface. The electronic switch is specially used to control the power conversion of the corresponding power-supply path interface to achieve various functions of power-down test.

Furthermore, in this application, one electronic switch can also corresponds to multiple power-supply path interfaces. In this case, the controller (MCU, Micro Controller Unit) needs to be set accordingly. Specifically, when the power-down test switches between different power-supply path interfaces, the same electronic switch can be associate with different power-supply path interfaces in different time periods, and according to the specific associated power-supply path interface, the controller can issue corresponding power change control instructions to the electronic switch, so that the electronic switch can accurately perform the power-down test on the storage device in the current scenario. Understandably, in a manner of one electronic switch corresponding to different power-supply path interfaces, the electronic switch needs to be configured with circuit configuration conditions that can simultaneously satisfy different power change control schemes. In a manner of one electronic switch corresponding to one power-supply path interface, the circuit configuration conditions of the electronic switch can be reduced. Furthermore, in a manner of one electronic switch corresponding to one power-supply path interface, each power-supply path interface can choose to select an electronic switch from multiple electronic switches to establish an association. In other words, one electronic switch and one power-supply path interface is no longer the only binding relationship, the relationship between the electronic switch and the power-supply path interface can be flexibly changed. For this kind of design, in this application, synchronous testing of multiple power-down test devices can be realized. Even if the same power-supply path interface is used for power-down test, through associating different electronic switches to implement the synchronous testing of multiple power-down test devices, the idle electronic switch can be effectively used and the power-down test efficiency can be significantly improved.

S40: Determining at least one target device to be tested.

In one embodiment, during the formal testing phase, one or more target devices actually used for power-down testing can be selected from storage devices that are possibly be used in the power-down testing. It should be noted that, the target device can generally be set to the same group of storage devices. For example, multiple SSD devices can be grouped in the same group for testing, and pen drives can be grouped to another group for testing. Of course, the solution in this application can support the power-down testing for at least two types of the storage devices, and there are no restrictions on specific test objects.

S50: Obtaining at least one power-down test instruction according to the at least one target device, wherein each of the power-down test instruction includes a power-supply path establishment parameter and a power-down execution parameter.

It should be noted that, the power test system established in this application is an intelligent integrated test system. The power test system includes a controller that executes power-down test logics, and the controller also integrates other functions to implement unified scheduling and control functions internally and externally in the power test system. Among them, the controller includes memory and processor. Other modules of the power test system also include corresponding memory and processors, allowing intelligent interactions between the processor and the modules in the memory.

In one embodiment, when the target device is connected to the power test system for power-down test, the target device may communicate with the controller, and the power-down test for the target device may be performed through the controller. Specifically, after the target device is connected to the power test system, the controller may generate one or more corresponding power-down test instructions according to the target device to implement the power-down test of the target device according to the power-down test instructions. Among them, it should be noted that, the power-down test instruction is not randomly generated. The generation and content of the power-down test instruction are related to the target device specifically connected to the power test system. The power-down test instructions generated corresponding to different target devices are generally different to distinguish and implement different power-down test functions for different target devices.

Further, the power-down test instruction specifically includes power-supply path establishment parameter and power-down execution parameter. Among them, the power-supply path establishment parameter refers to the parameters used to establish the relevant power-supply path in the power test system according to the target device. The power-down execution parameter refers to the parameters used to perform the power change control operation on the electronic switch in the power test system according to the target device, so as to realize different power-down test functions through the power-down execution parameter.

In one embodiment, in this application, the target device is used as an external device in the power test system, and a system that coordinates internally and performs unified power-down testing only through the externally connected target device is constructed.

S60: Establishing a target power-supply path corresponding to the target device from the at least one power-supply path interface and the at least one of the electronic switch according to the power-supply path establishment parameter.

In one embodiment, after the target device is connected, a bridge for power-down test of the target device is built inside the power test system based on the target device. The bridge is also referred to as the target power-supply path. Specifically, the power test system can determine the object and manner for building the bridge through the power-supply path establishment parameter sent by the controller. Specifically, one or more power-supply path interfaces used to build a bridge can be determined according to the power-supply path establishment parameter, and after one or more electronic switches that can satisfy the power-down test requirements of the target device is selected, the target power-supply path corresponding to the target device can be established. In this way, the target device can run normally through the target power-supply path, and specific power-down function tests can be executed during operation period of the target device, thereby achieving unified, accurate and fast power-down testing for different target devices.

S70: On the target power-supply path, performing a power-down operation according to the power-down execution parameter to perform a power-down test on the target device.

In one embodiment, after the target device is connected and the target power-supply path is established, in order to realize different power-down test functions for the target device, such as complete power off, voltage dropping from a higher value to a lower value, power output being limited outside a threshold value and so on, the power-down operation to be performed can be determined through the power-down execution parameter, so as to realize the power-down function test expected by the tester on the target device.

In the embodiment of the present application, a power test system for realizing power-down test is provided. The power test system integrates the power-supply path interfaces and electronic switches in the system based on the power-supply path manners of the power-down test device. Through the power-supply path interfaces and electronic switches, the corresponding target power-supply path can be built according to the target device to be tested and the actual test scenario. Among them, the target path construction process realizes logical docking and construction through a dedicated controller in the system. In addition, the controller can also perform the power-down operation expected by the user on the target power-supply path through the power-down execution parameter according to the power-down test requirements, thereby achieving fast, accurate, comprehensive and flexible power-down test for the target device. In this application, the power test system can solve the original problems of too many test steps and difficulty in setting up a test environment. The power test system can realize different power-down tests on different storage devices in one system, and support test users to change the power-down test scenarios during the test process, thereby significantly improving the power-down test efficiency of storage devices.

Figure 2:
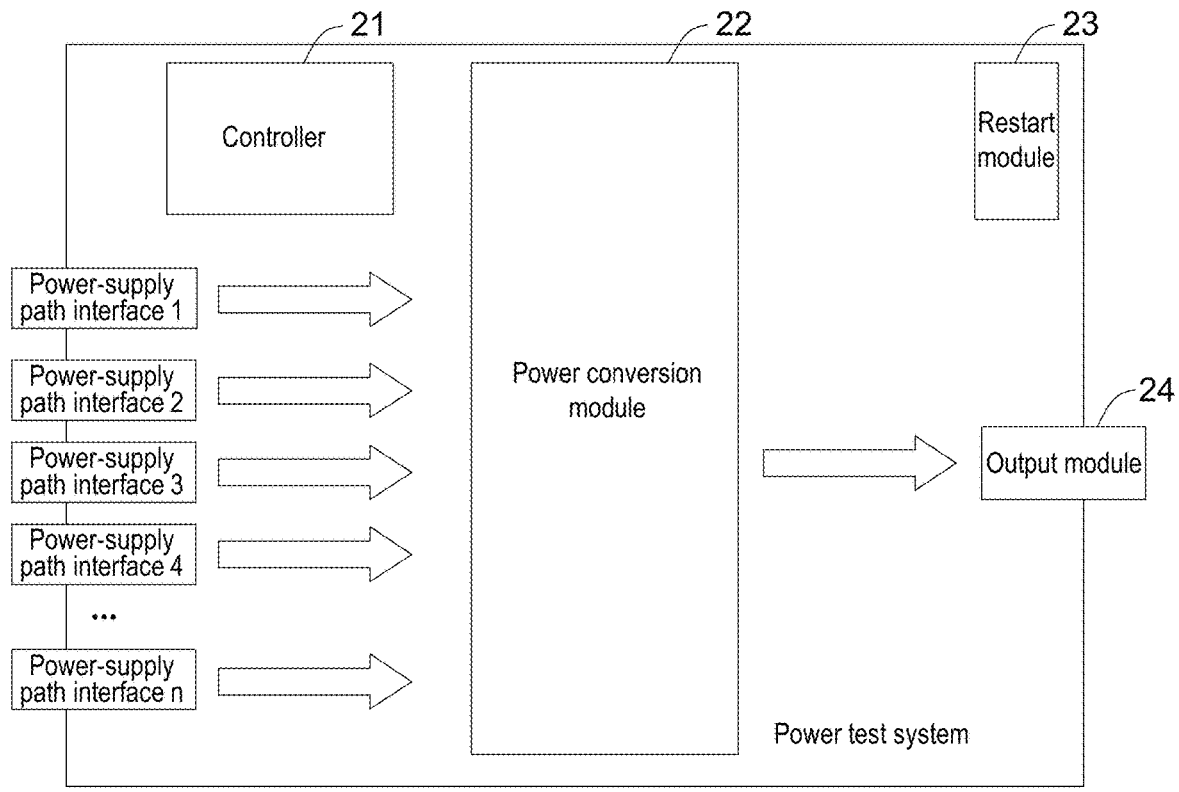
FIG. 2 is a functional block diagram of a power test system according to an embodiment of the present application.

FIG. 2 is a functional block diagram of a power test system according to an embodiment of the present application. As shown in FIG. 2, the power test system may specifically include multiple interfaces of power-supply path interface 1-*n*, a controller 21, a power conversion module 22, a restart module 23 and an output module 24. Among them, the various power-supply path interfaces 1-*n* and the power conversion module 22 can be used to establish the target power-supply path and build the test environment/channel required for the power-down test of the target device. The controller 21 can receive instructions from a host computer and generate a variety of different functions, so as to achieve accurate power-down testing of the target device through the controller 21. Among them, the restart module 23 is a module that implements the power restart function after power-down during the power-down test process, and can restart the target device after power-down to restore the target device to the original state; the output module 24 may include multiple output ports, and the output ports may be connected to one or more target devices, thereby enabling power-down testing of different storage devices. Among them, it should be noted that, the component modules in the power test system can be equipped with corresponding memories and processors to implement communication and interaction between different modules and enabling of specific functions through storing the instructions in the memories, and the processor can implement the above power-down test steps according to the instructions stored in the memories.

Figure 3:
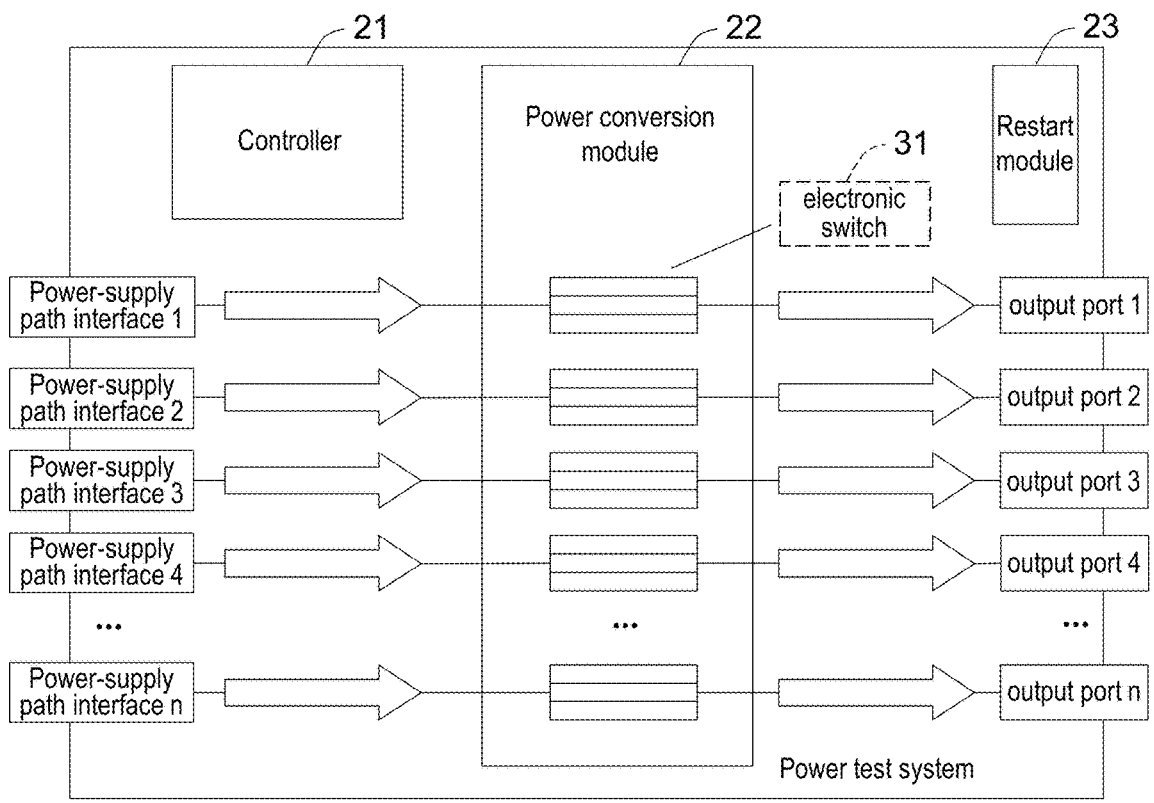
FIG. 3 is another functional block diagram of a power test system according to an embodiment of the present application.

FIG. 3 is another functional block diagram of a power test system according to an embodiment of the present application. As shown in FIG. 3, the main difference between FIG. 3 and FIG. 2 is that, the power conversion module 22 can specifically include multiple electronic switches 31, and the output module 24 includes multiple output ports such as output ports 1-$n$; in addition, the power-supply paths in the power test system of FIG. 3 corresponds to the electronic switches 31 one-by-one; in addition, electronic switches 31 and output ports 1-$n$ can also be set to be corresponding to each other one-by-one. The manner shown in FIG. 3 can facilitate the management of the power-supply path interface. During the power-down test, the system does not need to determine how to select the power-supply path interface and the electronic switch, but only needs to establish the target power-supply path based on the unique mapping relationship.

Furthermore, on the basis of FIG. 3, the electronic switches 31 and the output ports 1-$n$ may not be set to be corresponding to each other one-by-one. In this case, when establishing the target power-supply path, the power test system may select an appropriate electronic switch 31 based on the power-supply path interface 1-$n$. This manner is relatively low in implementation cost, and the system flexibility and maintainability are relatively high, and it supports replacement for failed electronic components.

Figure 4:
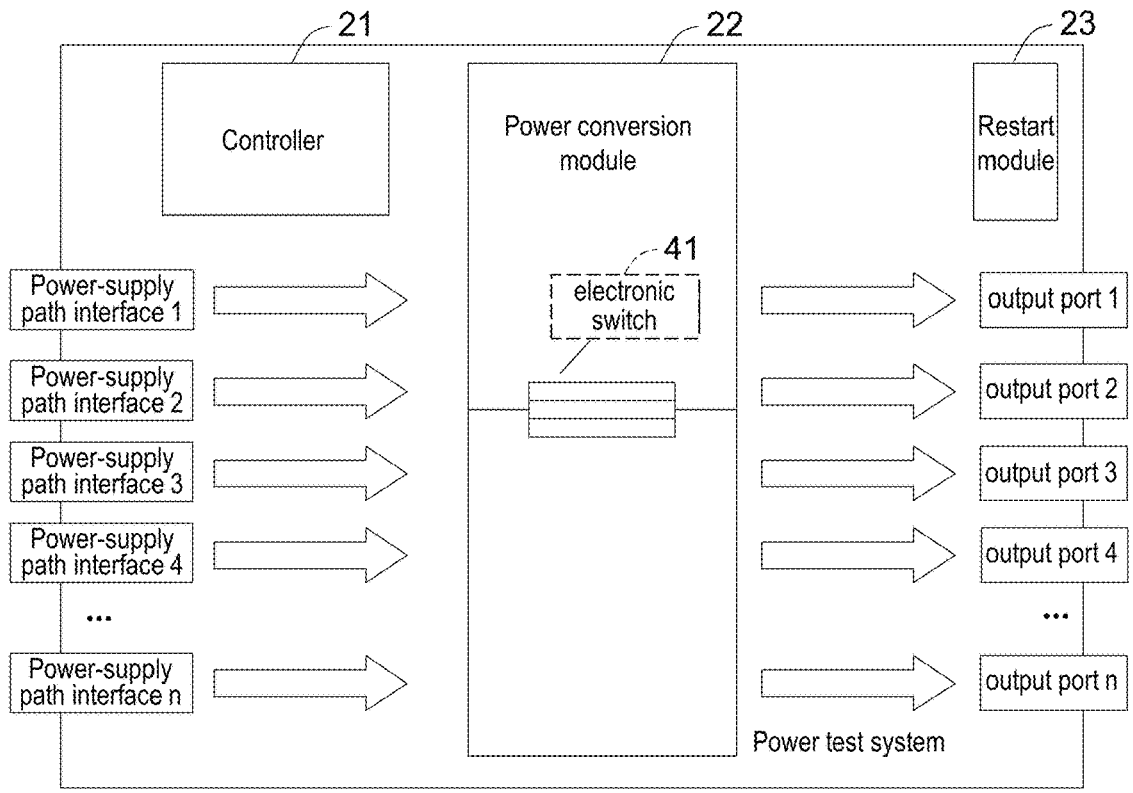
FIG. 4 is another functional block diagram of a power test system according to an embodiment of the present application.

FIG. 4 is another functional block diagram of a power test system according to an embodiment of the present application. As shown in FIG. 4, the main difference between FIG. 4 and FIG. 2 is that, the power conversion module 22 is specifically provided with only one electronic switch 41, and the output module 24 includes multiple output ports such as output ports 1-$n$. This manner has higher requirements on the ability of the electronic switch 41 to control changes in electric energy, but at the same time, any power-supply path interface can establish the target power-supply path required for testing through the electronic switch 41.

Furthermore, on the basis of FIG. 4, multiple electronic switches 41 with strong ability to control electric energy changes can also be set up as shown in FIG. 4. In this way, multiple target power-supply paths can be established at the same time to achieve the power-down tests for multiple target devices within the same time period. Moreover, in this manner, the system does not need to determine how to select power-supply path interface 1-$n$ and electronic switches 41 during power-down test.

Figure 5:
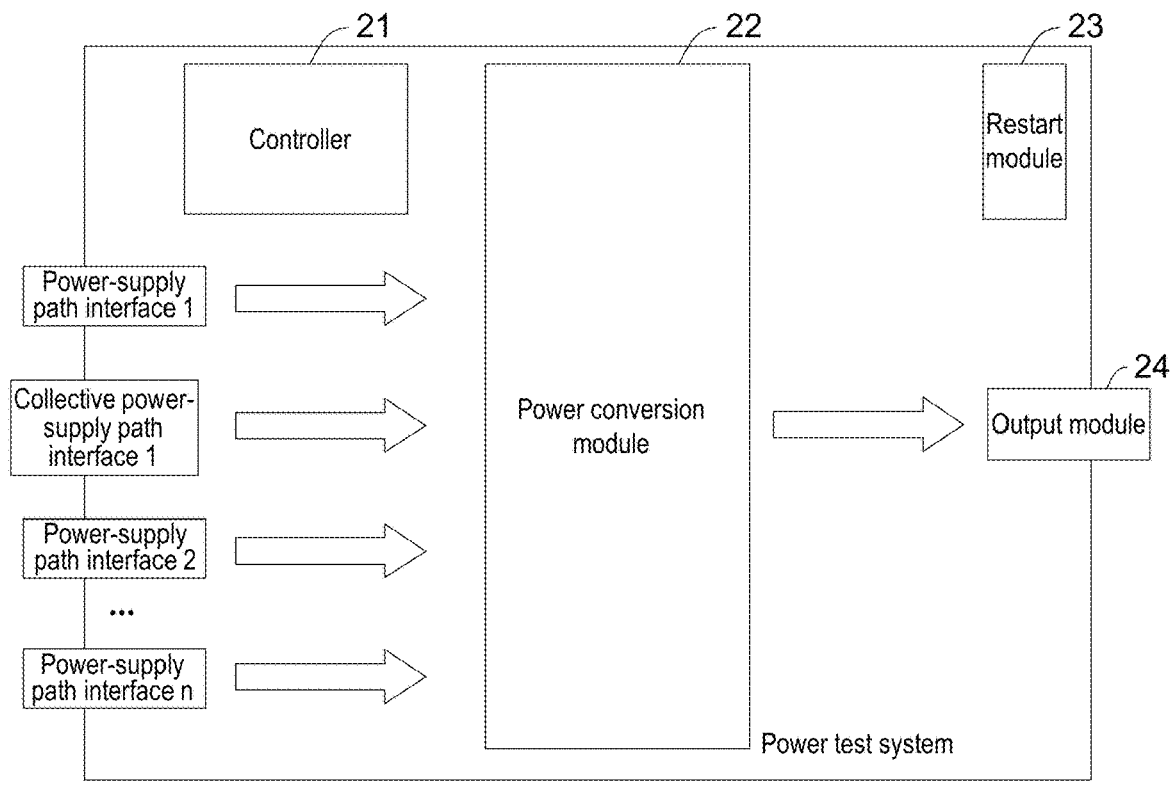
FIG. 5 is another functional block diagram of a power test system according to an embodiment of the present application.

FIG. 5 is another functional block diagram of a power test system according to an embodiment of the present application. As shown in FIG. 5, the main difference between FIG. 5 and FIG. 2 is that, multiple power-supply path interfaces 1-$n$ in FIG. 5 can support collective encapsulation, such as the collective power-supply path interface 1 in FIG. 5; for example, the interface that implements the power-supply function of a pen drive and the interface that implements power-supply and communication can be integrated using a hub, which can simplify the complexity of the power-supply path interface in this system.

Further, in step S50, the step of obtaining at least one corresponding power-down test instruction according to at least one target device specifically includes the following steps:

S516: Obtaining device information of at least one target device.

In one embodiment, different target devices have different power-down test requirements for test users. Even for the same storage device, the power-down testing scenarios includes the device running out of power, the power-supply being suddenly cut off, and power-down due to some special reasons. For this purpose, each target device is distinguished in this application, and the distinction can be made specifically through device information. Among them, the device information may specifically be the device number or device ID of the device, or other information that can directly distinguish different storage devices. The specific expression form of the device information is not limited here.

S517: Matching the device information with a power-down test table to obtain the at least one power-down test instruction, wherein a mapping relationship between the device information and the at least one of the power-down test instruction is stored in the power-down test table.

In one embodiment, a power-down test table can be stored in the memory of the target device. The power-down test table is set based on different power-down test requirements of different target devices, so that the power test system can perform the power-down test operations expected by test users for different target devices when different target devices is connected to the power test system, thereby achieving accurate power-down test effects. Specifically, after the target device is connected to the power test system, the power test system can identify the storage device that currently requires power-down testing through device information. The power test system may match the device information with the power-down test table, and find at least one power-down test instruction corresponding to the target device in the power-down test table according to the mapping relationship corresponding to the device information and the power-down test table. The controller can use the at least one power-down test instruction to implement the power-down test of the target device.

Furthermore, the power-down test table can be expanded and managed. When a new target device is added, a new mapping relationship can be added to the power-down test table. In this way, even if there are power-down test requirements of other new types of target devices, the power test system can quickly and easily satisfy the power-down test requirements of the target device.

Among them, the power-down test table can be pre-established between power-down tests. In step S50, that is, before obtaining at least one corresponding power-down test instruction according to at least one target device, the following steps are also included:

S511: Determining device information of different power-down test devices.

In one embodiment, the device information of the storage device on which the power-down test to be performed can be recorded, and the device information can be used to distinguish different power-down test devices.

S512: Determining the power-supply path manner and power-down triggering manner of the corresponding power-down test device based on the device information.

In one embodiment, the power-down test device has multiple power-supply path manners. Even the same power-down test device has multiple power-supply path manners. In this application, device information is used to bind the power-supply path manner of the power-down test device, so that multiple power-supply path manners corresponding to the target device and the power-down triggering manners corresponding to the user's test requirements on different power-supply path manners can be obtained after the target device is connected to the power test system. Therefore, the test channel accurately corresponds to the target device can be built and accurate power-down testing can be achieved.

S513: Determining the power-supply path generation instruction set according to the power-supply path manner, wherein the power-supply path generation instruction set and the power-supply path establishment parameter have a mapping relationship therebetween.

In one embodiment, the present application can also support automatic generation of instruction sets. For example, after the power-supply path manner of the target device is determined, the power-supply path generation instruction set corresponding to the power-supply path manner is then generated. The power-supply path generation instruction set includes multiple instructions related to the generation of specific power-supply path manner. The power test system can use the power-supply path generation instruction set to automatically build a test channel related to the target device to quickly establish and satisfy the building requirements of test environments of the target device. Among them, the power-supply path generation instruction set can be specifically set to have a mapping relationship with the power-supply path establishment parameter to quickly build an available test channel by identifying the power-supply path establishment parameter.

S514: Determining the power-down timing triggering instruction set according to the power-down triggering manner, wherein the power-down timing triggering instruction set and the power-down execution parameter have a mapping relationship therebetween.

In one embodiment, after the power-down triggering manner of the target device is determined, a power-down timing triggering instruction set corresponding to the power-down triggering manner is generated. The power-down timing triggering instruction set includes multiple instructions related to the generation of power-down operation. The power test system can use the power-down timing triggering instruction set to automatically determine and execute various power-down operations to be performed on the target device, thereby achieving the purpose of fast and accurate power-down test of the target device.

S515: Generating a power-down test table according to the device information, the power-supply path establishment parameter and the power-down execution parameter to execute the corresponding power-supply path generation instruction set and power-down timing triggering instruction set according to the power-down test table.

In one embodiment, this application distinguishes different target devices based on device information, and uses the power-supply path establishment parameter and the power-down execution parameter to generate a power-down test table, so that at the test stage, the power test system can use the power-down test table to quickly and accurately determine the test channels that need to be built for the connected target device and the power-down test operations required, thereby efficiently and reliably realizing unified power-down test management of different target devices.

In steps S511-S517, a new idea based on unified systematic power-down test is proposed. The test user only needs to connect the target device to be tested to the power test system, and the power test system can accordingly establish the test environment and the power-down test operations required for the target device, and the power test system can support power-down tests for different target devices. Specifically, this application can establish a power-down test table having a mapping relationship with the target device based on the power-supply path manner and power-down triggering manner, and quickly and accurately generate the power-supply path generation instruction set and power-down timing triggering instruction set related to the power-down test through the power-down test table, and implement the complete power-down test based on these instruction set.

Further, in step S60, that is, the step of establishing a target power-supply path corresponding to the target device from at least one power-supply path interface and at least one electronic switch according to the power-supply path establishment parameter, the step include the following: step:

S61: Determining the power-down test path and voltage control interval of the target device based on the power-supply path establishment parameter.

In one embodiment, the power test system can search and obtain one or more power-down test paths corresponding to the power-supply path establishment parameter based on the generated power-supply path establishment parameter. That is, the power-supply path manner of the target device that may be adopted during the power-down test process can be determined. In addition, the voltage control interval can also be found based on the power-supply path establishment parameter. The voltage control interval specifically reflects the voltage operation change requirements of the electronic switch during power-down test. Different electronic switches may have different voltage control range intervals. Therefore, the appropriate voltage control components, that can be used for the current target device power-down test requirements, can be found from the electronic switches according to the voltage control interval. In this application, the power-supply path establishment parameter can be used to support the finding of the appropriate target object from the power-supply path interfaces and electronic switches.

S62: According to the power-down test path, select the power-supply path interface that satisfies the power-down test path from at least one power-supply path interface as the first path point.

In one embodiment, the power test system has multiple power-supply path interfaces. This application can use the power-down test path to find the interface that can be used to establish the target power-supply path from multiple power-supply path interfaces of the power test system, and use these power-supply path interfaces as first path points. Among them, when the power-supply path interface in the power test system is a common interface included in the target device, the selection condition is satisfied.

Understandably, there can be multiple target power-supply paths, and the starting point of each target power-supply path is the first path point. During power-down test, power-down test can be performed on one target power-supply path alone, or the power-down test can be performed on multiple target power-supply paths simultaneously, which can significantly improve the flexibility of power-down test.

S63: According to the power-down test path, selecting an electronic switch that satisfies the voltage control interval from at least one electronic switch as the second path point.

In one embodiment, when the voltage control interval can meet the requirements of each power-down test of the target device, the selection conditions are satisfied, and the selected electronic switch is determined as the second path point and serves as a key node for implementing the electric energy change control in the target power-supply path.

S64: Establishing a connection relationship from the first path point to the second path point to obtain the target power-supply path.

In one embodiment, according to different power-down test requirements, the first path point and the second path point can be connected, so that the requirement of the power-supply path interface of the target device can be satisfied by connecting the first path point and the second path point, and the electric energy change control condition required for the power-down test on the target device can also be satisfied to obtain the target power-supply path. The target power-supply path is the path that the electric energy passes when a power-down test is performed on the target device, thereby achieving a targeted power-down test of the target device.

In steps S61-S64, a method of establishing a target power-supply path is provided. By disassembling the power-supply path interfaces and electronic switches, various types required for power-down test can be flexibly transformed or switched. In this way, the target power-supply path of the target device can be quickly established, which significantly improves the testing efficiency of power-down test on different target devices.

Further, in step S70, that is, on the target power-supply path, the step of executing the power-down operation according to the power-down execution parameter further includes the following specific steps:

S71: When a power-down test is performed on the target device through the target power-supply path, the event observation instruction is generated according to the power-down execution parameter, wherein the event observation instruction is used during the period of the power-down test.

Understandably, it is very difficult to conduct different power-down function tests on the target device in an orderly and accurate manner during the power-down test process. This application implements the accuracy and orderliness of power-down test through the introducing of event observation during the power-down test process.

In one embodiment, the power test system generates an event observation instruction according to the power-down execution parameter when the target device performs a power-down test. The event observation instruction monitors the entire power-down test process. Through determining the power-down test operation to be performed by the target device from different states of target device in the power-down test process, the target device can perform various power-down function tests expected by users in an orderly and accurate manner.

S72: Determining the power-down test event to which the target device currently belongs according to the event observation instruction.

In one embodiment, during the power-down test process, the target device including different states (the states can be distinguished by setting some parameters) corresponding to different power-down test events. The power-down test event reflects the current or next power-down function test should be performed on the target device. For example, the next power-down function test is to simulate the test after the target device runs out of power, or the next power-down function test is to simulate the target device suddenly encountering a power outage, or the next power-down function test is to simulate the voltage of the target device dropping from a higher value to a lower value which causes voltage instability and insufficient power-supply. In this application, the power-down test event to which the target device currently belongs can be obtained through the event observation instruction, thereby making more precise control over the power-down test and improving the timeliness and accuracy of the power-down test.

S73: Obtaining at least one corresponding power-down feature information according to the power-down test event.

Among them, power-down feature information reflects information related to the nature of power-down, that is, it can be understood that some power-down feature information can be used to describe the circuit status of the test circuit during power-down function testing, such as whether the test circuit is about to appear a power outage situation. In one embodiment, the power-down feature information may specifically include voltage value, voltage change rate (amplitude of voltage change within a preset time), temperature, etc. These power-down feature information are useful for power-down prediction of certain power-down function tests. This application uses this power-down feature information to achieve precise control of the power-down test process.

S74: Using at least one power-down feature information to determine the power-down triggering timing of the power-down test, and generating a power-down timing triggering instruction according to the power-down triggering timing to use the power-down timing triggering instruction to perform the power-down operation in a default time cycle.

In one embodiment, this application can predict or calculate the power-down timing on the target power-supply path in advance through multiple power-down feature information. That is, at a specific time point, the controller can issue instructions to the electronic switch to control the change of electric energy, so as to achieve controllable power-down test purposes. Specifically, through the manner of generating the power-down timing triggering instruction, the power-down timing triggering instruction can be executed after default time cycle, so that the corresponding power-down operation can be executed accurately at the time when the power-down test is required, which can improve the accuracy and high adaptability of the power-down test for target device, and achieve the purpose of power-down function test with controllable timing.

In steps S71-S74, the event observation instruction is used to realize full timing control of the circuit status. The power test system can determine the power-down test event to which the target device currently belongs through event observation during the test process, and accurately calculate the power-down timing by obtaining at least one power-down feature information, which allows the power-down test to be arranged at the optimal time point, and makes the power-down test timing of the target device to be controllable.

Further, in step S72, that is, the step of determining the power-down test event to which the target device currently belongs according to the event observation instruction, the following steps are specifically included:

S721: Obtaining the power-down test count and one-time power-down test clock value according to the event observation instruction.

In one embodiment, in this application, the event observation instruction is specifically set to comprehensively determining the state to which the target power-supply path currently belongs from the counting situation and the clock situation. Specifically, the event observation instruction can obtain power-down test count and one-time power-down test clock value. The power-down test count is used to count statistics of power-down tests that have been performed. One-time power-down test clock value refers to the total time consumed in each round of power-down test. Among them, after the target power-supply path executes the power-down timing triggering instruction, if no power-down behavior is detected after a preset time interval, the one-time power-down test clock value is recorded based on the time point after the interval.

S722: When the power-down test count is 0, determining the power-down test event to which the target device currently belongs as an initial power-down test event, and each time a new power-down test event is confirmed, setting a count value of the power-down test event to be increased by 1, and after the initial power-down test event ends, the count value of the power-down test event is set to 1.

In one embodiment, this application configures an initial power-down test event, which is the default power-down function test used in the first test. Then, based on the initial power-down test event, the count value is accumulated to change the presentation of different power-down test events. It should be noted that, without the setting of the initial power-down test event, the automation of the power-down test cannot work. Therefore, the initial power-down test event can be regarded as a driving point.

S723: When the power-down test count is not 0, and a difference value between a current one-time power-down test clock value and a previous one-time power-down test clock value is greater than a preset times of a clock cycle, then determining the power-down test event to which the target device currently belongs as the new power-down test event, and the count value of the power-down test event is increased by 1.

In one embodiment, considering that the same power-down function test may be performed multiple times, the same power-down function test performed multiple times may be regarded as the same power-down test event. In this regard, this application further configures a one-time power-down test clock value. When the difference value between the current one-time power-down test clock value and the previous one-time power-down test clock value is greater than a preset multiple of clock cycle, it means that the difference of time consumption between the current power-down test of this time and the last power-down test is larger and they belong to different power-down tests. Therefore, the power-down test event to which the target device currently belongs can be considered as a new power-down test event.

Understandably, the count value of the power-down test event will gradually accumulate until all power-down tests of the target device are completed. It should be noted that, from the perspective of power-down test execution, the power-down test is executed continuously, and there is no concept of power-down test event itself. However, in this application, the concept of power-down test event is set. Through performing real-time analysis during the power-down test process, the target device can accurately catch the power-down triggering timing when performing different power-down function tests, thereby achieving a better power-down test effect.

S724: Each time the power-down test is performed, determining the power-down test event to which the target device currently belongs according to the count value of the power-down test event, so as to perform a corresponding power-down operation.

In one embodiment, different count values can reflect different power-down test stages. Through the count value and the preset mapping relationship with the power-down test event, the power-down test event to which the target device belongs can be determined. Therefore, the power-down operation required for the test can be executed in the power-down test event, thereby improving the test accuracy and enabling accurate control of the timing of the power-down operation.

In steps S721-S724, through the power-down test count and one-time power-down test clock value to reflect the operating status of the target power-supply path, the power-down test event to which the target device currently belongs can be accurately obtained. Therefore, the appropriate power-down operation for the power-down test event can be performed.

Further, in step S73, that is, in the step of obtaining at least one corresponding power-down feature information according to the power-down test event, the following steps are specifically included:

S731: Querying a corresponding power-down test feature table according to the power-down test event, wherein the power-down test feature table stores a numerical mapping relationship between a power-down test event number and a power-down feature information number.

S732: Converting the power-down test event into the corresponding power-down test event number, and determining the power-down feature information number according to the numerical mapping relationship and the power-down test event number.

S733: Obtaining the power-down feature information corresponding to the power-down test event according to the power-down feature information number.

In steps S731-S733, by digitizing the power-down test event and the power-down information, a two-dimensional streamlined association is achieved. The power test system can quickly obtain at least one corresponding power-down feature information according to the power-down test event, and use the power-down feature information to improve the control of power-down triggering timing.

Further, in step S74, that is, the step of using at least one power-down feature information to determine the power-down triggering timing of the power-down test, the following steps are specifically included:

S744: Obtaining a power-down feature value corresponding to each type of the power-down feature information from at least one power-down feature information.

In one embodiment, the power-down feature information is set with a corresponding power-down feature value, and the power-down feature value reflects an attribute of the power-down feature information.

S745: Determining a power-down feature interval value according to the power-down feature value.

In one embodiment, each power-down feature value is included in a power-down feature interval. In this application, because there is no way to do a mapping relationship for the power-down triggering timing corresponding to each power-down feature value (the power-down feature value is theoretically infinite), the power-down feature interval manner is set. Different power-down feature values are classified using the interval thinking, and then power-down feature interval value and power-down feature value are used to obtain a power-down triggering timing that is closer to the actual value. The power-down feature interval value is a reference value in the power-down feature interval. The power-down feature interval value may be an intermediate value of the power-down feature interval.

S746: Obtaining a one-time conversion table corresponding to the power-down feature interval value, and calculate a target time predicted by the difference value of the power-down feature value according to the one-time conversion table.

Among them, one-time conversion table refers to a mapping relationship table of time correspondingly converted by converting the difference value between the power-down feature value and the power-down feature interval value with a basis of one-time clock cycle on the power-down feature interval. It can also be understood that, when the difference value between the power-down feature value and the power-down feature interval value is reached, the power-down feature value can be converted according to the one-time conversion table corresponding to the power-down feature interval value to obtain the difference time between the power-down feature value and the power-down feature interval value.

S747: Obtaining an occurrence time corresponding to the power-down feature interval value, and determine the power-down triggering timing of the power-down test according to the occurrence time corresponding to the power-down feature interval value and the target time predicted by the difference value of the power-down feature value.

In one embodiment, after determining the occurrence time corresponding to the power-down feature interval value and the target time predicted by the difference value of the power-down feature value, the power-down triggering timing can be predicted more accurately.

In steps S744-S747, the difference time between the power-down feature value and the power-down feature interval value is obtained by the conversion using the one-time conversion table. Therefore, in a case that there is no way to do a mapping relationship for the power-down triggering timing corresponding to each power-down feature value, the power-down triggering timing can be accurately predicted.

Further, before step S74, that is, before the step of using at least one power-down feature information to determine the power-down triggering timing of the power-down test, the following steps are specifically included:

S741: Establishing a mapping relationship between the power-down feature interval value and a power-down feature interval, wherein the number of the power-down feature interval is one or more, and each power-down feature interval corresponds to one power-down feature interval value.

In one embodiment, in the stage before the power-down test, the power-down feature intervals can be pre-divided, and a power-down feature interval value for reference can be determined on each power-down feature interval.

S742: Determining a power-down test occurrence time according to the power-down feature interval value.

In one embodiment, it is necessary to measure the accurate power-down test occurrence time of the power-down feature interval value, so as to make a standard time comparison between the power-down feature interval value and subsequent values on the power-down feature interval.

S743: In each of the power-down feature interval, calculating a conversion value corresponding to a one-time clock cycle with a corresponding power-down feature interval value as a reference, and storing the conversion value in the one-time conversion table, so as to predict the power-down triggering timing of the power-down test by using the one-time conversion table.

In one embodiment, one-time clock cycle can be used as the base for conversion, and time based on one-time clock cycle can be used as the conversion of the numerical difference.

In steps S741-S743, a specific implementation manner of establishing a one-time conversion table is provided. The manner of converting time using numerical differences can further improve the accuracy of power-down triggering timing prediction.

Furthermore, the processor of the power test system in this application also performs the following steps:

S81: Obtaining the newly added power-down test device.

S82: Determining whether a new power-supply path manner needs to be added based on the newly added power-down test device.

S83: If it is necessary to add a new power-supply path manner, add the power-supply path interface corresponding to the power-supply path manner in the power test system.

S84: Determining whether a new electronic switch needs to be added based on the newly added power-down test device.

S85: If it is necessary to add a new electronic switch, add the electronic switch in the power test system.

In steps S81-S85, the addition of new power-down test devices can be supported under the originally constructed power-down test system, which is highly inclusive and scalable, and is easy to implement.

An embodiment of the present application also provides a power control device, which includes the power test system of the above embodiment and at least one target device to be tested. The target device can implement power-down test through the power test system. Among them, the power test system also includes executing the following steps through the processor:

Obtaining at least one power-supply path manner of at least one power-down test device;

Determining at least one power-supply path interface according to at least one power-supply path manner;

Determining at least one electronic switch according to at least one power-supply path interface, wherein the electronic switch is used to control changes in electric energy;

Determining at least one target device to be tested;

Obtaining at least one corresponding power-down test instruction according to at least one target device, wherein each power-down test instruction includes a power-supply path establishment parameter and a power-down execution parameter;

According to the power-supply path establishment parameter, establishing a target power-supply path corresponding to the target device from at least one power-supply path interface and at least one electronic switch;

On the target power-supply path, performing power-down operation according to the power-down execution parameter to perform power-down test on the target device.

Further, obtaining at least one corresponding power-down test instruction according to at least one target device also includes the processor performing the following steps:

Obtaining device information of at least one target device;

Matching device information with power-down test table to obtain at least one power-down test instruction, wherein the mapping relationship between device information and at least one power-down test instruction is stored in the power-down test table;

Among them, the power-down test table is pre-established, and before obtaining at least one corresponding power-down test instruction according to at least one target device, the processor also performs the following steps:

Determining the device information of different power-down test devices;

Determining the power-supply path manner and power-down triggering manner of the corresponding power-down test device according to the device information;

Determining a power-supply path generation instruction set according to the power-supply path manner, wherein the power-supply path generation instruction set and the power-supply path establishment parameter have a mapping relationship therebetween;

Determining a power-down timing triggering instruction set according to the power-down triggering manner, wherein the power-down timing triggering instruction set and the power-down execution parameter have a mapping relationship therebetween;

Generating the power-down test table according to the device information, the power-supply path establishment parameter and the power-down execution parameter, so as to execute the corresponding power-supply path generation instruction set and the power-down timing triggering instruction set according to the power-down test table.

In the embodiment of this application, a new idea based on unified and systematic power-down test is proposed. The test user only needs to connect the target device to be tested to the power test system, and the power test system can correspondingly establish test environments and power-down test operations required by the target device to support power-down tests for different target devices. Specifically, this application can establish a power-down test table having a mapping relationship with the target device based on the power-supply path manner and power-down triggering manner, and quickly and accurately generate the power-supply path generation instruction set and power-down timing triggering instruction set related to the power-down test through the power-down test table. Based on these instruction sets, a complete power-down test can be implemented.

Further, according to the power-supply path establishment parameter, the target power-supply path corresponding to the at least one target device between the at least one power-supply path interface and the at least one electronic switch also includes the processor performing the following steps:

Determining the power-down test path and voltage control interval of the target device according to the power-supply path establishment parameter;

According to the power-down test path, select the power-supply path interface that satisfies the power-down test path from the at least one power-supply path interface as a first path point;

According to the power-down test path, select the electronic switch that satisfies the voltage control interval from the at least one electronic switch as a second path point;

Establishing a connection relationship from the first path point to the second path point to obtain the target power-supply path.

In this application, a manner for establishing a target power-supply path is provided. By disassembling the power-supply path interface and the electronic switch, it can be flexibly transformed and switched to various forms required for power-down test. The target power-supply path of the target device can be quickly established, which significantly improves the testing efficiency of power-down test on different target devices.

Further, on the target power-supply path, performing a power-down operation according to the power-down execution parameter further includes the processor performing the following steps:

when the target device performs a power-down test through the target power-supply path, generating an event observation instruction according to the power-down execution parameter, wherein the event observation instruction is used during the power-down test;

Determining the power-down test event to which the target device currently belongs according to the event observation instruction;

Obtaining corresponding at least one power-down feature information according to the power-down test event;

Using the at least one power-down feature information to determine the power-down triggering timing of the power-down test, and generating a power-down timing triggering instruction according to the power-down triggering timing to use the power-down timing triggering instruction to execute the power-down operation after a default time cycle.

In this application, the event observation instruction is used to realize full timing control of the circuit status. The power test system can determine the power-down test event to which the current target device belongs through event observation during the test process, and accurately calculate the power-down timing by obtaining at least one power-down feature information, so as to allow the power-down test to be arranged at the optimal time, and to make the power-down test timing of the target device to be controllable.

Further, determining the power-down test event to which the target device currently belongs based on the event observation instruction further includes the processor performing the following steps:

Obtaining a power-down test count and one-time power-down test clock value according to the event observation instruction;

When the power-down test count is 0, determining the power-down test event to which the at least one target device currently belongs as an initial power-down test event, and each time a new power-down test event is confirmed, set a count value of the power-down test event to be increased by 1, and after the initial power-down test event ends, the count value of the power-down test event is set to 1;

When the power-down test count is not 0, and a difference between a current one-time power-down test clock value and a previous one-time power-down test clock value is greater than a preset times of a clock cycle, determining the power-down test event to which the at least one target device currently belongs as the new power-down test event, and the count value of the power-down test event is increased by 1;

Each time the power-down test is performed, determining the power-down test event to which the at least one target device belongs according to the count value of the power-down test event, so as to perform a corresponding power-down operation.

In this application, the operation status of the target power-supply path is reflected at two levels: power-down test count and one-time power-down test clock value, and the power-down test event to which the current target device belongs can be accurately obtained, thereby executing the appropriate power-down operation for the power-down test event.

Further, obtaining the corresponding at least one power-down feature information according to the power-down test event further includes the processor performing the following steps:

Querying a power-down test feature table according to the power-down test event, wherein the power-down test feature table stores a numerical mapping relationship between a power-down test event number and a power-down feature information number;

Converting the power-down test event into the power-down test event number, and determine the power-down feature information number according to the numerical mapping relationship and the power-down test event number;

Obtaining the power-down feature information corresponding to the power-down test event according to the power-down feature information number.

In this application, by digitizing the power-down test event and the power-down feature information, a two-dimensional streamlined association is achieved. The power test system can quickly obtain at least one corresponding power-down feature information based on the power-down test event, and use this power-down feature information to improve the control of power-down triggering timing.

Further, using the at least one power-down feature information to determine the power-down triggering timing of the power-down test further includes the processor performing the following steps:

Obtaining a power-down feature value corresponding to each type of the power-down feature information from the at least one power-down feature information;

Determining a power-down feature interval value according to the power-down feature value;

Obtaining a difference value between the power-down feature interval value and the corresponding power-down feature value, wherein the difference value has a multiple relationship with a clock cycle;

Obtaining a one-time conversion table corresponding to the power-down feature interval value, and calculate a target time predicted by the difference value of the power-down feature value according to the one-time conversion table;

Obtaining an occurrence time corresponding to the power-down feature interval value, and determine the power-down triggering timing of the power-down test according to the occurrence time corresponding to the power-down feature interval value and the target time predicted by the difference value of the power-down feature value.

In this application, the time difference between the power-down feature value and the power-down feature interval value can be calculated by using the one-time conversion table, such that the power-down triggering timing can be accurately predicted in a case that mapping relationship between the power-down triggering timing and each type of power-down feature value cannot be established.

Further, before using the at least one power-down feature information to determine the power-down triggering timing of the power-down test, the processor further performs the following steps:

Establishing a mapping relationship between the power-down feature interval value and a power-down feature interval, wherein the number of the power-down feature interval is one or more, and each power-down feature interval corresponds to one power-down feature interval value;

Determining a power-down test occurrence time according to the power-down feature interval value;

In each of the power-down feature interval, calculating a conversion value corresponding to a one-time clock cycle with a corresponding power-down feature interval value as a reference, and storing the conversion value in the one-time conversion table, so as to predict the power-down triggering timing of the power-down test by using the one-time conversion table.

This application provides a specific implementation manner for establishing a one-time conversion table. By using a manner of converting time based on numerical differences, the accuracy of power-down triggering timing prediction can be improved.

Further, in the power test system, the processor further performs the following steps:

Obtaining a newly added power-down test device;

Determining whether a new power-supply path manner needs to be added based on the newly added power-down test device;

If it is necessary to add the new power-supply path manner, adding a power-supply path interface corresponding to the new power-supply path manner in the power test system;

Determining whether a new electronic switch needs to be added based on the newly added power-down test device;

If it is necessary to add the new electronic switch, adding the new electronic switch in the power test system.

In this application, the addition of new power-down test devices can be supported under the originally constructed power-down test system, which is highly inclusive and scalable, and is also easy to implement.

In this application, a power control device for realizing power-down test is provided. The power test system integrates the power-supply path interfaces and electronic switches in this system based on the power-supply path manners of the power-down test devices, and through the power-supply path interfaces and electronic switches, the corresponding target power-supply path can be built according to the target devices to be tested and the actual test scenario. Among them, the target path construction process realizes logical docking and construction through a dedicated controller in the system. In addition, the controller can also perform the power-down operation expected by the user through the power-down execution parameter on the target power-supply path according to the power-down test requirements, thereby achieving fast, accurate, comprehensive and flexible power-down test on the target device. In this application, the power test device can solve the original problems of too many test steps and difficulty in setting up a test environment. It can realize different power-down tests on different storage devices in one system, and support test users to change the different test scenarios during the test process, thereby improving the power-down test efficiency of storage devices.

What is claimed is:

1. A power test system, wherein the system comprises a memory and a processor, a plurality of instructions executed by the processor are stored in the memory, and the processor is configured to:

obtain at least one power-supply path manner of at least one power-down test device;

determine at least one power-supply path interface according to the at least one power-supply path manner;

determine at least one electronic switch according to the at least one power-supply path interface, wherein the at least one electronic switch is used to control a change of electrical energy;

determine at least one target device to be tested;

obtain device information of the at least one target device;

match the device information with a power-down test table to obtain at least one power-down test instruction, wherein the power-down test table stores a mapping relationship between the device information and the at least one power-down test instruction;

wherein the power-down test table is pre-established, each of the at least one power-down test instruction includes a power-supply path establishment parameter and a power-down execution parameter;

establish, according to the power-supply path establishment parameter, a target power-supply path corresponding to the at least one target device between the at least one power-supply path interface and the at least one electronic switch; and on the target power-supply path, perform a power-down operation according to the power-down execution parameter to perform a power-down test on the at least one target device.

2. The system according to claim 1, wherein the processor is further configured to:

determine the device information of different power-down test devices;

determine the power-supply path manner and a power-down triggering manner corresponding to the at least one power-down test device according to the device information;

determine a power-supply path generation instruction set according to the power-supply path manner, wherein the power-supply path generation instruction set has a mapping relationship with the power-supply path establishment parameter;

determine a power-down timing triggering instruction set according to the power-down triggering manner, wherein the power-down timing triggering instruction set has a mapping relationship with the power-down execution parameter; and generate the power-down test table according to the device information, the power-supply path establishment parameter and the power-down execution parameter, so as to execute the power-supply path generation instruction set and the power-down timing triggering instruction set according to the power-down test table.

3. The system according to claim 1, wherein in the operation of establishing, according to the power-supply path establishment parameter, the target power-supply path corresponding to the at least one target device between the at least one power-supply path interface and the at least one electronic switch, the processor is further configured to:

determine a power-down test path and a voltage control interval of the at least one target device according to the power-supply path establishment parameter;

select the power-supply path interface that satisfies the power-down test path from the at least one power-supply path interface as a first path point according to the power-down test path;

select the electronic switch that satisfies the voltage control interval from the at least one electronic switch as a second path point according to the power-down test path; and establish a path relationship from the first path point to the second path point to obtain the target power-supply path.

4. The system according to claim 1, wherein in the operation of, on the target power-supply path, perform the power-down operation according to the power-down execution parameter, the processor is further configured to:

when the at least one target device performs a power-down test through the target power-supply path, generate an event observation instruction according to the power-down execution parameter, wherein the event observation instruction is used during the power-down test;

determine a power-down test event to which the at least one target device currently belongs according to the event observation instruction;

obtain at least one power-down feature information according to the power-down test event; and use the at least one power-down feature information to determine a power-down triggering timing of the power-down test, and generate a power-down timing triggering instruction according to the power-down triggering timing, so as to use the power-down timing triggering instruction to perform the power-down operation after a preset time period.

5. The system according to claim 4, wherein in the operation of determining the power-down test event to which the at least one target device currently belongs according to the event observation instruction, the processor is further configured to:

obtain a power-down test count and a one-time power-down test clock value according to the event observation instruction;

when the power-down test count is 0, determine the power-down test event to which the at least one target device currently belongs as an initial power-down test event, and each time a new power-down test event is confirmed, set a count value of the power-down test event to be increased by 1, and after the initial power-down test event ends, the count value of the power-down test event is set to 1;

when the power-down test count is not 0, and a difference between a current one-time power-down test clock value and a previous one-time power-down test clock value is greater than a preset times of a clock cycle, determine the power-down test event to which the at least one target device currently belongs as the new power-down test event, and the count value of the power-down test event is increased by 1; and each time the power-down test is performed, determine the power-down test event to which the at least one target device belongs according to the count value of the power-down test event, so as to perform a corresponding power-down operation.

6. The system according to claim 4, wherein in the operation of obtaining the at least one power-down feature information according to the power-down test event, the processor is further configured to:

query a power-down test feature table according to the power-down test event, wherein the power-down test feature table stores a numerical mapping relationship between a power-down test event number and a power-down feature information number;

convert the power-down test event into the power-down test event number, and determine the power-down feature information number according to the numerical mapping relationship and the power-down test event number; and obtain the power-down feature information corresponding to the power-down test event according to the power-down feature information number.

7. The system according to claim 4, wherein in the operation of using the at least one power-down feature information to determine the power-down triggering timing of the power-down test, the processor is further configured to:

obtain a power-down feature value corresponding to each type of the power-down feature information from the at least one power-down feature information;

determine a power-down feature interval value according to the power-down feature value;

obtain a difference value between the power-down feature interval value and the power-down feature value, wherein the difference value has a multiple relationship with a clock cycle;

obtain an one-time conversion table corresponding to the power-down feature interval value, and calculate a target time predicted by a difference value of the power-down feature value according to the one-time conversion table; and obtain an occurrence time corresponding to the power-down feature interval value, and determine the power-down triggering timing of the power-down test according to the occurrence time corresponding to the power-down feature interval value and the target time predicted by the difference value of the power-down feature value.

8. The system according to claim 7, wherein before the operation of using the at least one power-down feature information to determine the power-down triggering timing of the power-down test, the processor is further configured to:

establish a mapping relationship between the power-down feature interval value and a power-down feature interval, wherein the power-down feature interval is one or more, and each of the power-down feature interval corresponds to one of the power-down feature interval value;

determine a power-down test occurrence time according to the power-down feature interval value; and in each of the power-down feature interval, calculate a conversion value corresponding to a one-time clock cycle with a corresponding power-down feature interval value as a reference, and store the conversion value in the one-time conversion table, so as to predict the power-down triggering timing of the power-down test by using the one-time conversion table.

9. The system according to claim 1, wherein the processor is further configured to:

obtain a newly added power-down test device;

determine whether a new power-supply path manner needs to be added based on the newly added power-down test device;

if it is necessary to add the new power-supply path manner, add a power-supply path interface corresponding to the new power-supply path manner in the power test system;

determine whether a new electronic switch needs to be added based on the newly added power-down test device; and if it is necessary to add the new electronic switch, add the new electronic switch in the power test system.

10. A power control device, comprising the power test system and the at least one target device to be tested of claim 1.

11. The power control device according to claim 10, wherein the processor is further configured to:

determine the device information of different power-down test devices;

determine the power-supply path manner and a power-down triggering manner corresponding to the at least one power-down test device according to the device information;

determine a power-supply path generation instruction set according to the power-supply path manner, wherein the power-supply path generation instruction set has a mapping relationship with the power-supply path establishment parameter;

determine a power-down timing triggering instruction set according to the power-down triggering manner, wherein the power-down timing triggering instruction set has a mapping relationship with the power-down execution parameter; and generate the power-down test table according to the device information, the power-supply path establishment parameter and the power-down execution parameter, so as to execute the power-supply path generation instruction set and the power-down timing triggering instruction set according to the power-down test table.

12. The power control device according to claim 10, wherein in the operation of establishing, according to the power-supply path establishment parameter, the target power-supply path corresponding to the at least one target device between the at least one power-supply path interface and the at least one electronic switch, the processor is further configured to:

determine a power-down test path and a voltage control interval of the at least one target device according to the power-supply path establishment parameter;

select the power-supply path interface that satisfies the power-down test path from the at least one power-supply path interface as a first path point according to the power-down test path;

select the electronic switch that satisfies the voltage control interval from the at least one electronic switch as a second path point according to the power-down test path; and establish a path relationship from the first path point to the second path point to obtain the target power-supply path.

13. The power control device according to claim 10, wherein in the operation of, on the target power-supply path, perform the power-down operation according to the power-down execution parameter, the processor is further configured to:

when the at least one target device performs a power-down test through the target power-supply path, generate an event observation instruction according to the power-down execution parameter, wherein the event observation instruction is used during the power-down test;

determine a power-down test event to which the at least one target device currently belongs according to the event observation instruction;

obtain at least one power-down feature information according to the power-down test event; and use the at least one power-down feature information to determine a power-down triggering timing of the power-down test, and generate a power-down timing triggering instruction according to the power-down triggering timing, so as to use the power-down timing triggering instruction to perform the power-down operation after a preset time period.

14. The power control device according to claim 13, wherein in the operation of determining the power-down test event to which the at least one target device currently belongs according to the event observation instruction, the processor is further configured to:
   obtain a power-down test count and a one-time power-down test clock value according to the event observation instruction;
   when the power-down test count is 0, determine the power-down test event to which the at least one target device currently belongs as an initial power-down test event, and each time a new power-down test event is confirmed, set a count value of the power-down test event to be increased by 1, and after the initial power-down test event ends, the count value of the power-down test event is set to 1;
   when the power-down test count is not 0, and a difference between a current one-time power-down test clock value and a previous one-time power-down test clock value is greater than a preset times of a clock cycle, determine the power-down test event to which the at least one target device currently belongs as the new power-down test event, and the count value of the power-down test event is increased by 1; and
   each time the power-down test is performed, determine the power-down test event to which the at least one target device belongs according to the count value of the power-down test event, so as to perform a corresponding power-down operation.

15. The power control device according to claim 13, wherein in the operation of obtaining the at least one power-down feature information according to the power-down test event, the processor is further configured to:
   query a power-down test feature table according to the power-down test event, wherein the power-down test feature table stores a numerical mapping relationship between a power-down test event number and a power-down feature information number;
   convert the power-down test event into the power-down test event number, and determine the power-down feature information number according to the numerical mapping relationship and the power-down test event number; and
   obtain the power-down feature information corresponding to the power-down test event according to the power-down feature information number.

16. The power control device according to claim 13, wherein in the operation of using the at least one power-down feature information to determine the power-down triggering timing of the power-down test, the processor is further configured to:
   obtain a power-down feature value corresponding to each type of the power-down feature information from the at least one power-down feature information;
   determine a power-down feature interval value according to the power-down feature value;
   obtain a difference value between the power-down feature interval value and the power-down feature value, wherein the difference value has a multiple relationship with a clock cycle;
   obtain an one-time conversion table corresponding to the power-down feature interval value, and calculate a target time predicted by a difference value of the power-down feature value according to the one-time conversion table; and
   obtain an occurrence time corresponding to the power-down feature interval value, and determine the power-down triggering timing of the power-down test according to the occurrence time corresponding to the power-down feature interval value and the target time predicted by the difference value of the power-down feature value.

17. The power control device according to claim 16, wherein before the operation of using the at least one power-down feature information to determine the power-down triggering timing of the power-down test, the processor is further configured to:
   establish a mapping relationship between the power-down feature interval value and a power-down feature interval, wherein the power-down feature interval is one or more, and each of the power-down feature interval corresponds to one of the power-down feature interval value;
   determine a power-down test occurrence time according to the power-down feature interval value; and
   in each of the power-down feature interval, calculate a conversion value corresponding to a one-time clock cycle with a corresponding power-down feature interval value as a reference, and store the conversion value in the one-time conversion table, so as to predict the power-down triggering timing of the power-down test by using the one-time conversion table.

18. The power control device according to claim 10, wherein the processor is further configured to:
   obtain a newly added power-down test device;
   determine whether a new power-supply path manner needs to be added based on the newly added power-down test device;
   if it is necessary to add the new power-supply path manner, add a power-supply path interface corresponding to the new power-supply path manner in the power test system;
   determine whether a new electronic switch needs to be added based on the newly added power-down test device; and
   if it is necessary to add the new electronic switch, add the new electronic switch in the power test system.

* * * * *